United States Patent [19]

Hollis

[11] Patent Number: 5,493,772

[45] Date of Patent: Feb. 27, 1996

[54] ORTHOGONAL POSITIONING MECHANISM FOR AN AUTOMATED MACHINE

[75] Inventor: Paul E. Hollis, Harrisburg, Pa.

[73] Assignee: The Whitaker Corp., Wilmington, Del.

[21] Appl. No.: 288,535

[22] Filed: Aug. 10, 1994

[51] Int. Cl.$^{6}$ .......................... H01R 43/26; H05K 13/02; H05K 13/04

[52] U.S. Cl. .............................. 29/747; 29/33 M; 29/760

[58] Field of Search ............................. 29/747, 759, 760, 29/33 M; 269/60, 903, 87.2

[56] References Cited

U.S. PATENT DOCUMENTS

| | | | |
|---|---|---|---|
| 4,597,158 | 7/1986 | Hirokawa et al. | 29/760 X |
| 4,754,865 | 7/1988 | Szumierz et al. | 29/747 X |
| 4,970,778 | 11/1990 | den Otter | 29/759 X |
| 5,092,029 | 3/1992 | Fisher et al. | 29/747 X |

FOREIGN PATENT DOCUMENTS

| | | | |
|---|---|---|---|
| 1035849 | 8/1983 | U.S.S.R. | 29/747 |
| 1515236 | 10/1989 | U.S.S.R. | 29/747 |

*Primary Examiner*—Peter Vo
*Attorney, Agent, or Firm*—Robert J. Kapalka

[57] ABSTRACT

A machine (10) for inserting metal hold down clips into a connector housing (26) is disclosed. An improved positioning mechanism (14) is provided for accurately positioning the housing (26) with respect to the parts to be inserted. The positioning mechanism (14) includes a track (64) for receiving and guiding the connector housing along a feed path and through an insertion workstation (60) where the hold down clips are inserted. The track (64) is vertically movable by a servo motor (100) while an adjacent feed mechanism (160) positions the connector housing along the track. The adjacent feed mechanism (160) is coupled to the track so that it moves vertically with movement of the track but moves horizontally by means of a second servo motor (190) independent of movement of the track. Both servo motors are mounted to the frame (12) structure and, therefore, do not contribute to the mass of the moving mechanisms.

11 Claims, 7 Drawing Sheets

ORTHOGONAL POSITIONING MECHANISM FOR AN AUTOMATED MACHINE

The present invention relates to an automated machine for inserting hold down clips and potentially other parts into a connector housing and more particularly to an improved positioning mechanism for accurately positioning the housing with respect to the parts to be inserted.

BACKGROUND OF THE INVENTION

In the manufacture of certain types of electrical connectors, the connector housing is fed along a feed track of an automated machine to a workstation for insertion of the metal contacts and metal hold down clips that are used to engage a hole in a circuit board for securing the connector to the board. Such a system works well only when the parts to be inserted are in mutual alignment or, where some are out of alignment, there is additional insertion tooling for those parts. In the case where a hold down clip is inserted in one end of the connector housing at one level with respect to the feed track and an identical clip is inserted in the other end of the housing at a different level, either the track must be shifted to realign the housing for the second insertion, or the housing must be arranged on a conventional X-Y table for providing the required orthogonal motion for proper positioning. Alternatively, the insertion head may be moved instead of shifting the housing, however, such a structure would be complex and expensive to manufacture. If the track is shifted the associated feed mechanism, including drive motors and drive trains, must also be shifted resulting in a substantial mass that must be moved. This, of course, requires larger drive motors and supporting structure that may adversely affect performance. However, the convenient flow of the parts along the track, that is an advantage characteristic of this type of feed mechanism, is preserved. When a conventional X-Y table is utilized instead of a feed track, the connector housing must then be manipulated by conventional pick and place equipment, thereby adding to the complexity and cost of the machine. Such use of an X-Y table will likely increases machine cycle time and may introduce reliability problems. This arrangement does not have the convenient flow of housings inherent in the feed track system. Additionally, one or more of the drive motors of the X-Y table is usually included in the mass that is moved. In any structure that requires that the drive motors be part of the mechanism that is moved, required electrical wiring that powers and controls the motors must necessarily be part of the moving mass as well. This adds to the mass and introduces other considerations such as flexibility 0f the wires and their possible failure due to fatigue.

What is needed is a connector housing positioning mechanism that preserves the convenient flow of housings offered by the feed track system while providing orthogonal motion for accurately positioning the housing for insertion of parts at different levels with respect to the feed track, and while minimizing the complexity and the amount of mass of the moving mechanism.

SUMMARY OF THE INVENTION

A machine is disclosed for inserting an article into a connector housing. The machine includes a frame, a workstation, and an inserter adjacent thereto for effecting the insertion within the workstation. A positioning mechanism is provided for positioning the connector housing in the workstation for receiving the article. The positioning mechanism includes a track coupled to the frame for guiding the connector housing along a feed path and into the workstation. The track is arranged to move in a first direction generally perpendicular to the feed path to align the housing with the inserter. A beam is coupled to the frame and arranged to move in a second direction parallel to the first direction and in a third direction parallel to the feed path. At least one feed finger is positionably attached to the beam, extending toward said track. The feed finger is arranged to engage the connector housing and move it within the track along the feed path into alignment with the inserter when the beam moves in the third direction. A coupling means is provided for coupling the beam to the track so that movement of the track in the first direction directly causes movement of the beam only in the second direction.

DESCRIPTION OF THE PREFERRED EMBODIMENT

Figure 1:
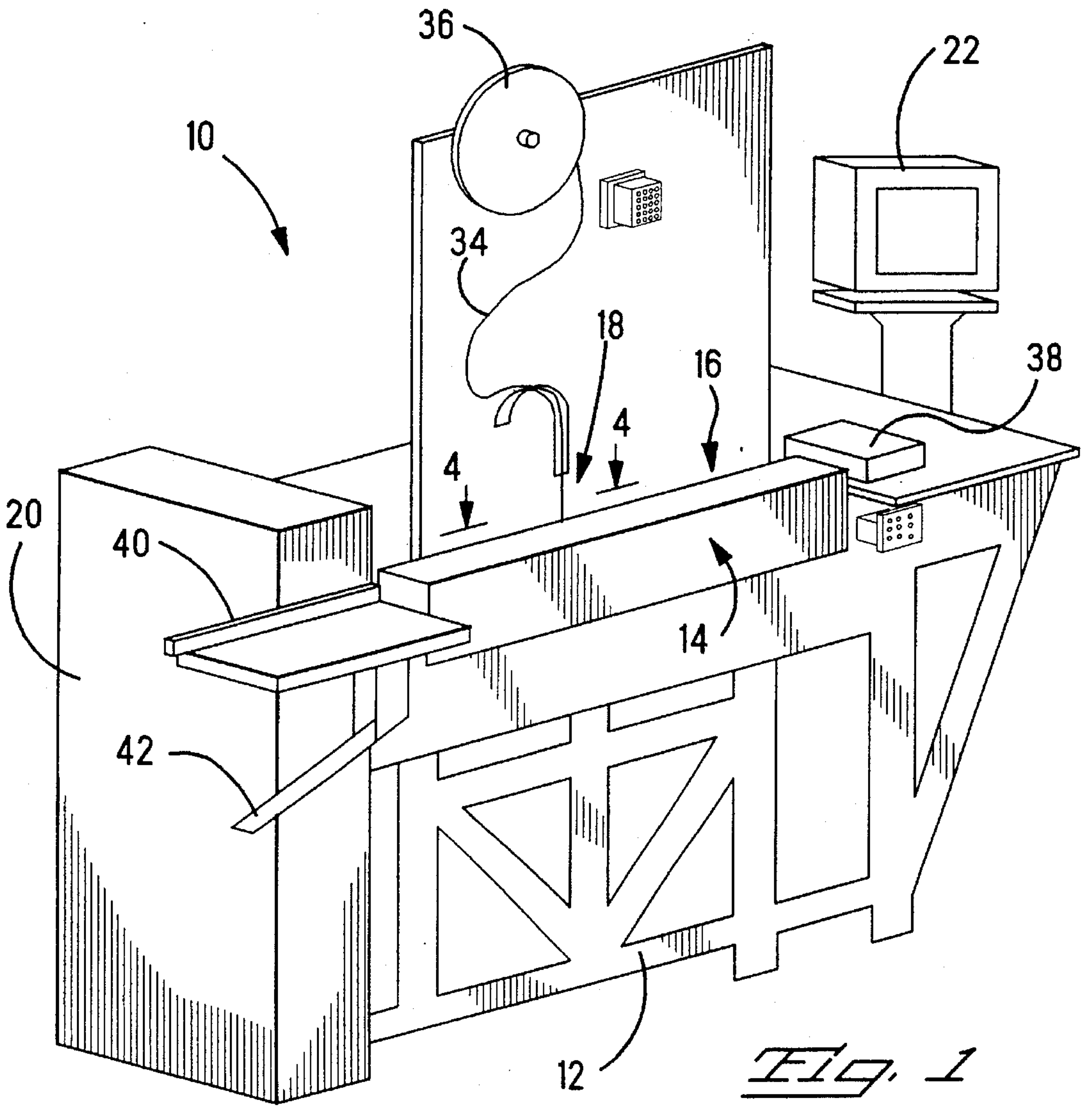
FIG. 1 is an isometric view of an automated machine incorporating the teachings of the present invention.
Figure 2:
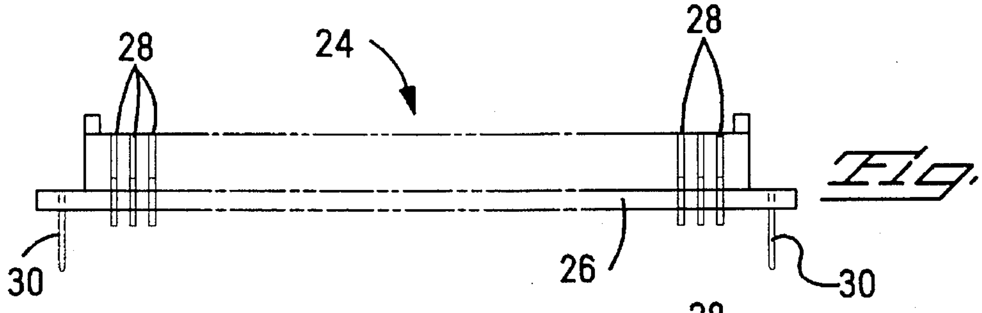
FIGS. 2 and 3 are front and bottom views, respectively, of a typical electrical connector that utilizes hold down clips.
Figure 3:
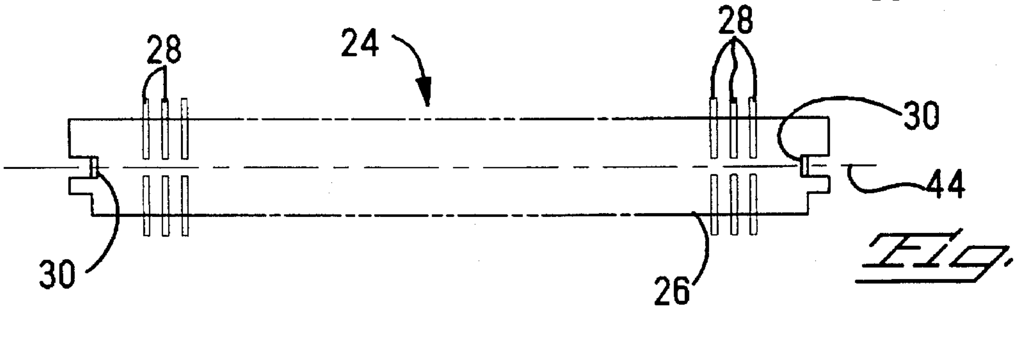

There is shown in FIG. 1 an automated machine 10 for performing work operations in the manufacture of electrical connectors, such as inserting hold down clips into the connector housings. The machine 10 includes a frame 12, a connector housing positioning mechanism 14, a work station 16 where a previous work operation may be performed on the connector, and a mechanism 18 for inserting a hold down clip into the connector housing. A programmable controller 20 and computer monitor 22 are provided to control the operation of the machine 10 in a manner that is well known in the industry. A typical electrical connector 24, that is processed by the machine 10, is shown in FIGS. 2 and 3. The connector 24 includes an insulating housing 26, a group of electrical contacts 28, and two metal hold down clips 30. As shown in FIG. 1 the hold down clips 30 are feed into the hold down insertion mechanism 18 attached to a carrier strip 34 which is dispensed from a reel 36. The connector housings 26 are provided to the machine 10 in magazines 38 or other suitable feed system, such as a feeder bowl, from which each individual connector housing is retrieved and inserted into the feed track of the machine. The individual connector housing 26 may then be processed in the workstation 16 and then fed along the feed track and picked up by the positioning mechanism 14 to present the housing to the hold down inserter 18. The completed connector 24 is then moved from the feed track into an exit port, in the present example a tube package 40 for storage. The machine 10 includes an error detection system that is able to identify incorrectly installed clips of other components. Such faulty assemblies are ejected into a different exit port, a chute 42 which leads to a scrap bin where the parts may be recycled or scrapped. Instead of the chute 42, faulty connectors may be moved into another tube package for later processing. It will be understood that the present invention may be used with any number of exit ports instead of the tube package 40 and chute 42. For example, connectors of different types or sizes may be directed to appropriately sized tubes or other type packages or containers.

As is shown in FIG. 3, the two hold down clips 30 are inserted into opposite ends of the connector housing 26, one clip being substantially on the longitudinal centerline 44 of the housing and the other being substantially above the centerline. The present invention is addressed to the positioning mechanism 14 for positioning the connector housing 24 with respect to tooling such as the hold down inserter 18 for inserting the two hold down clips 30, and then for directing the completed connector to an appropriate exit port such as either the tube package 40 or the discard chute 42, as appropriate.

Figure 4:
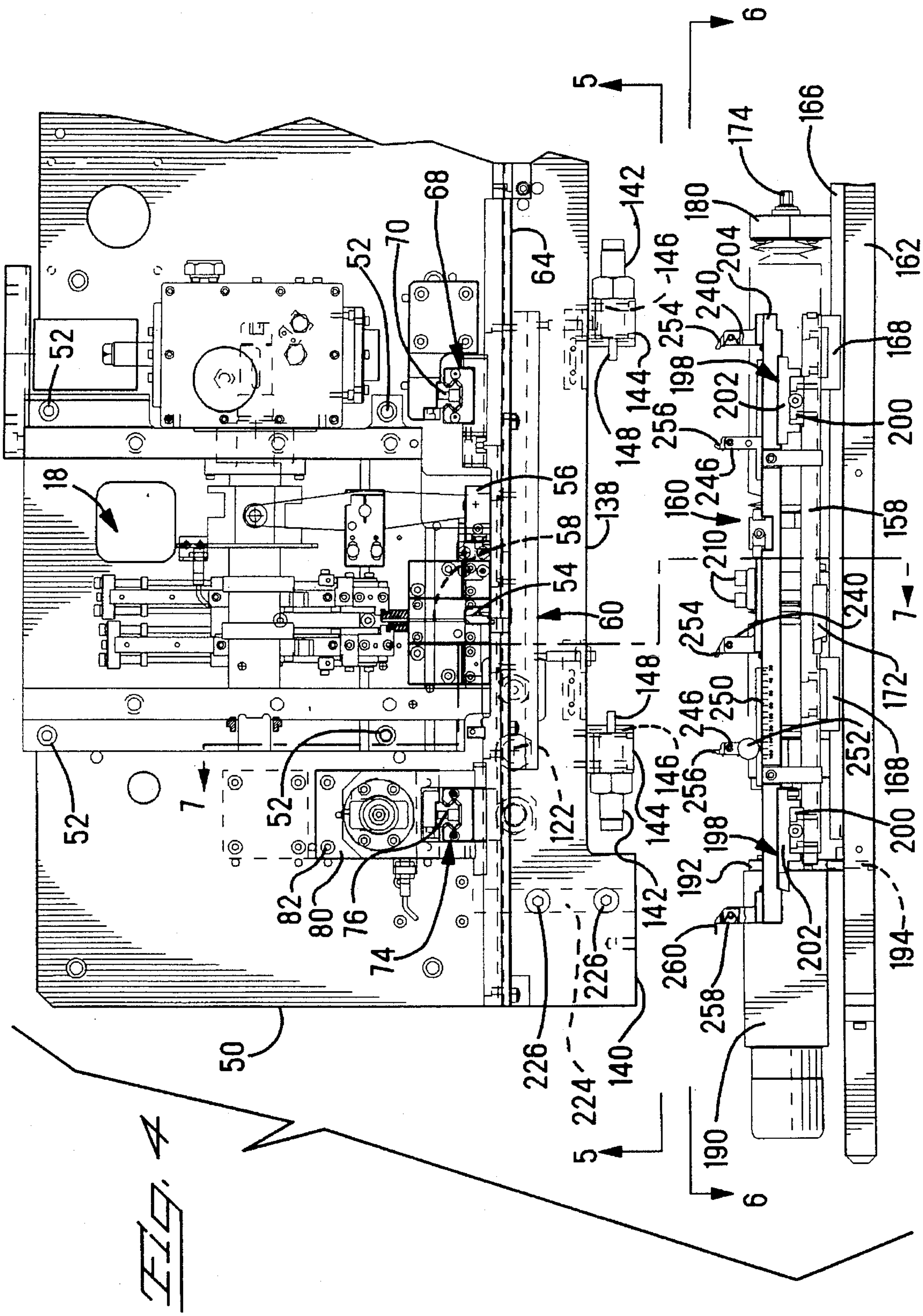
FIG. 4 is a plan view of the entire positioning mechanism and inserter taken along the lines 4—4 in FIG. 1 but showing the lateral positioning mechanism displaced for clarity.
Figure 5:
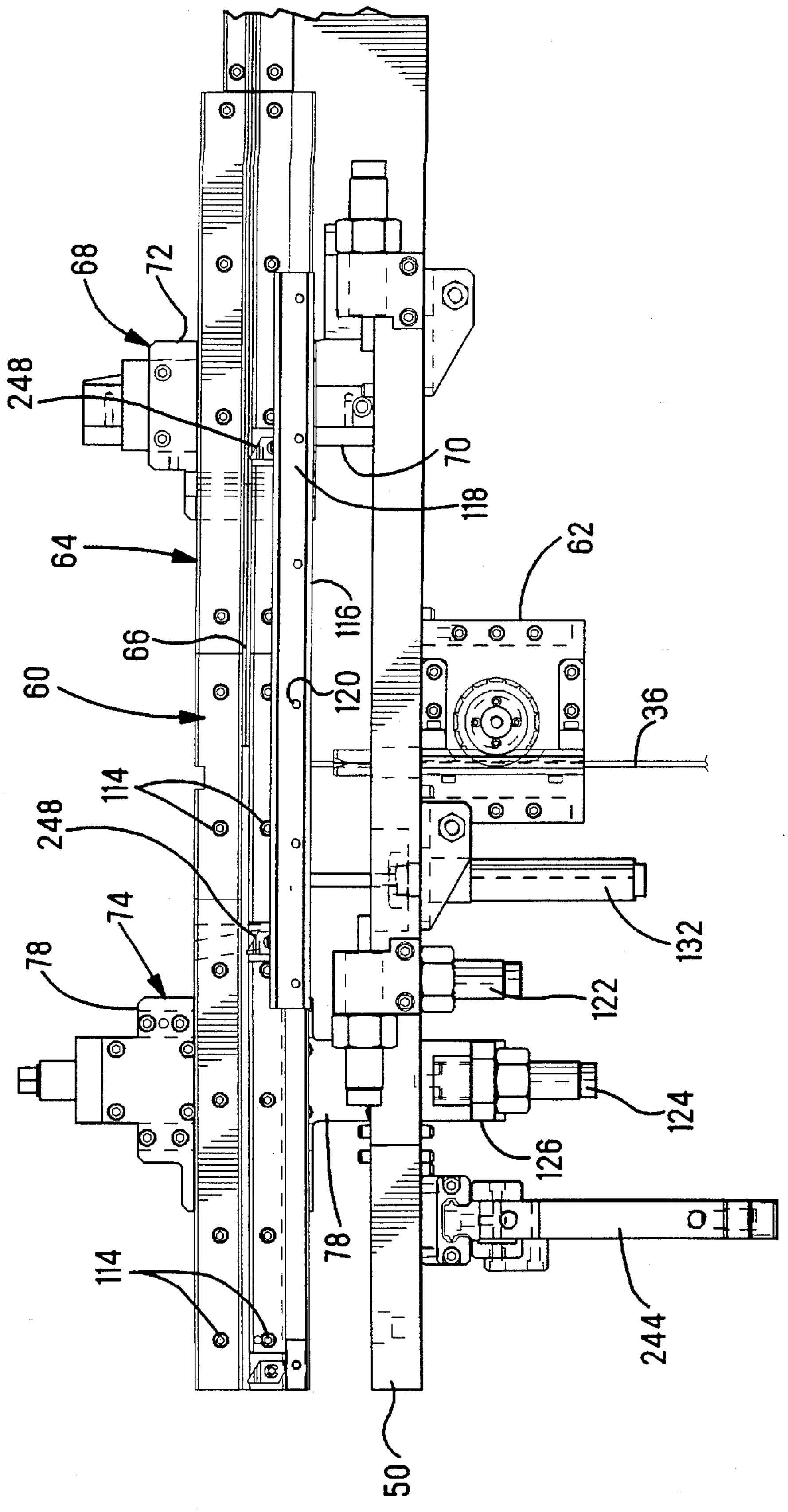
FIG. 5 is a cross-sectional view taken along the lines 5—5 in FIG. 4.
Figure 6:
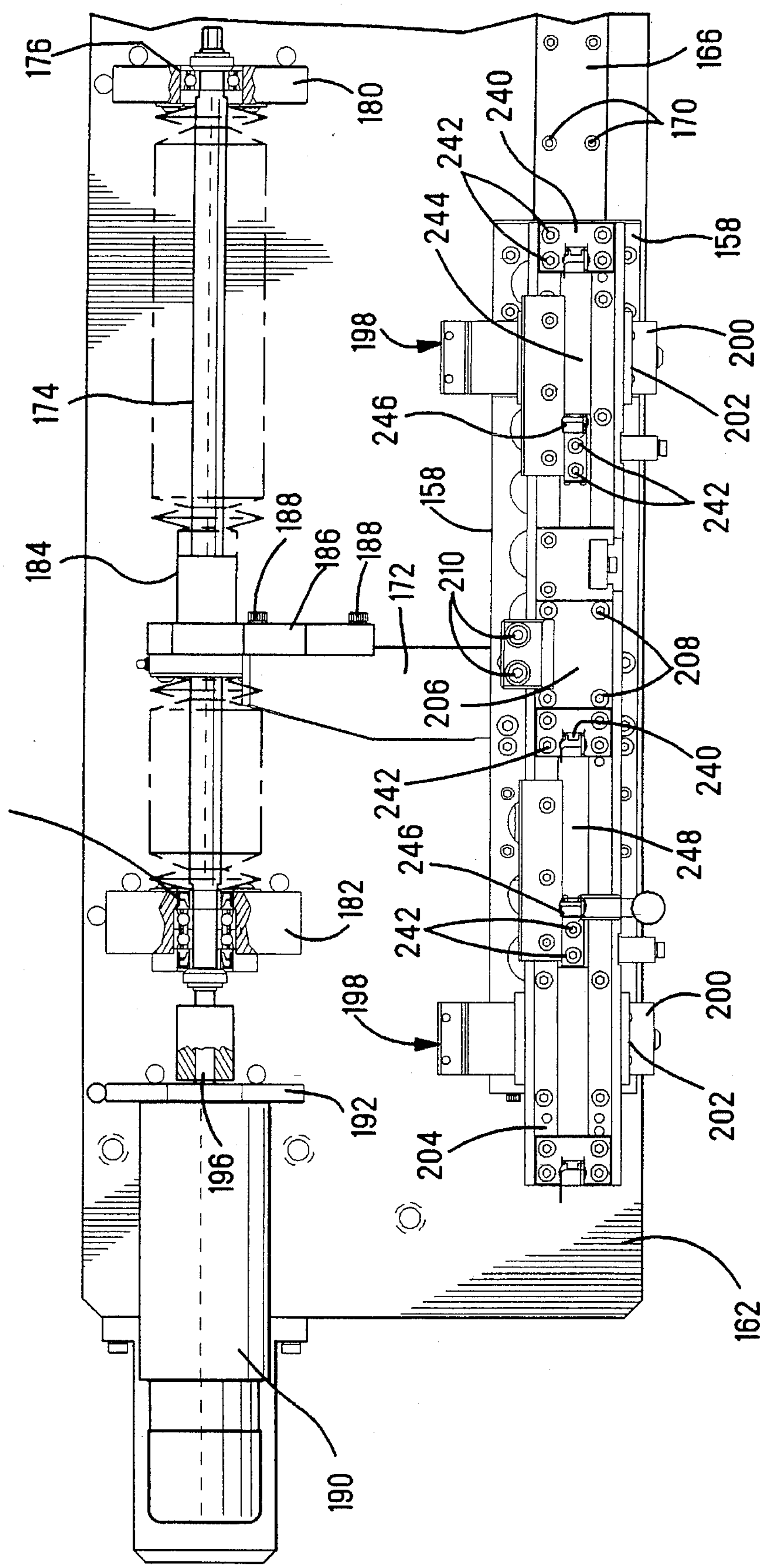
FIG. 6 is a cross-sectional view taken along the lines 6—6 in FIG. 4.
Figure 7:
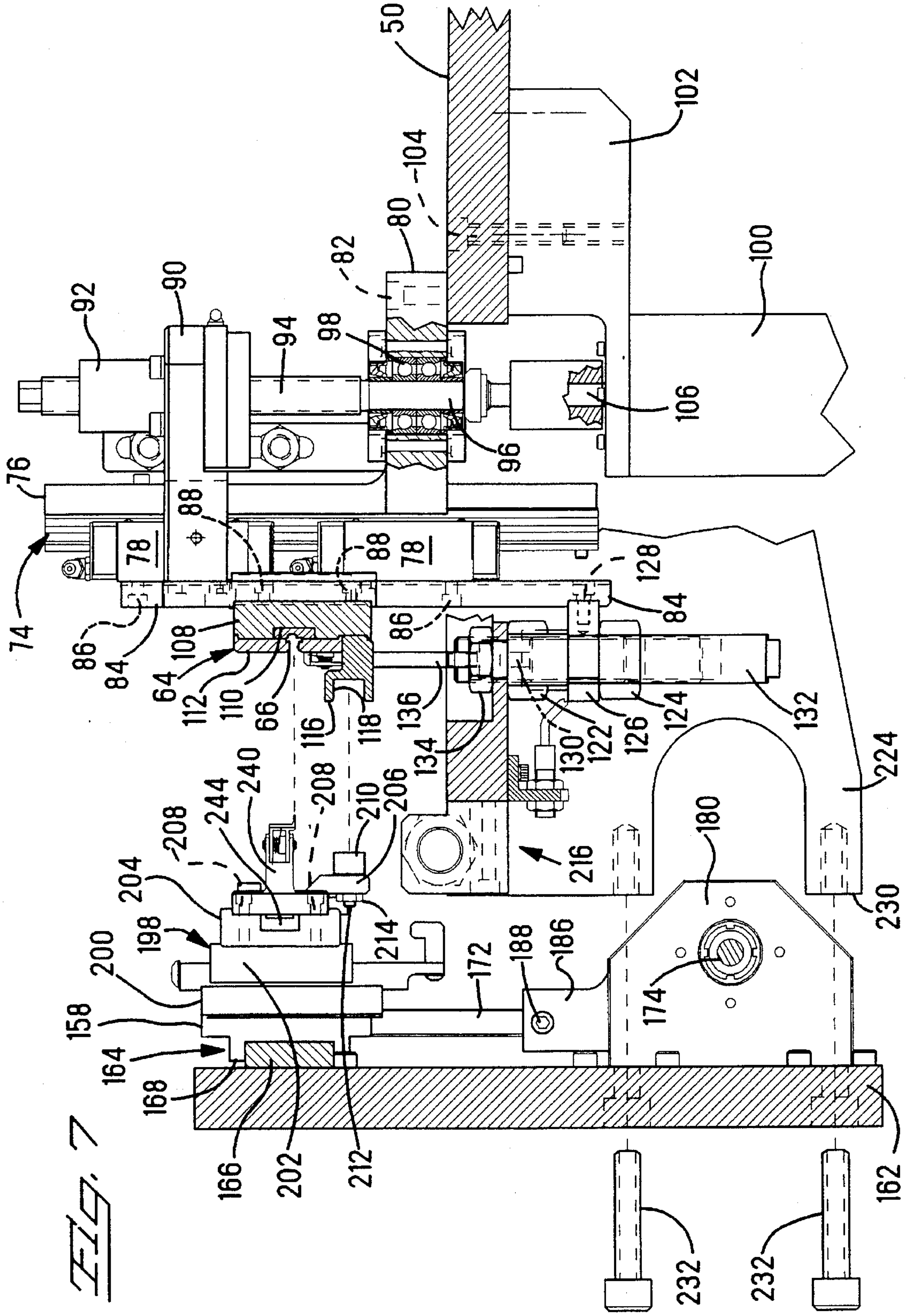
FIG. 7 is a cross-sectional view taken along the lines 7—7 in FIG. 4 showing the lateral positioning mechanism spaced as in FIG. 4.
Figure 8:
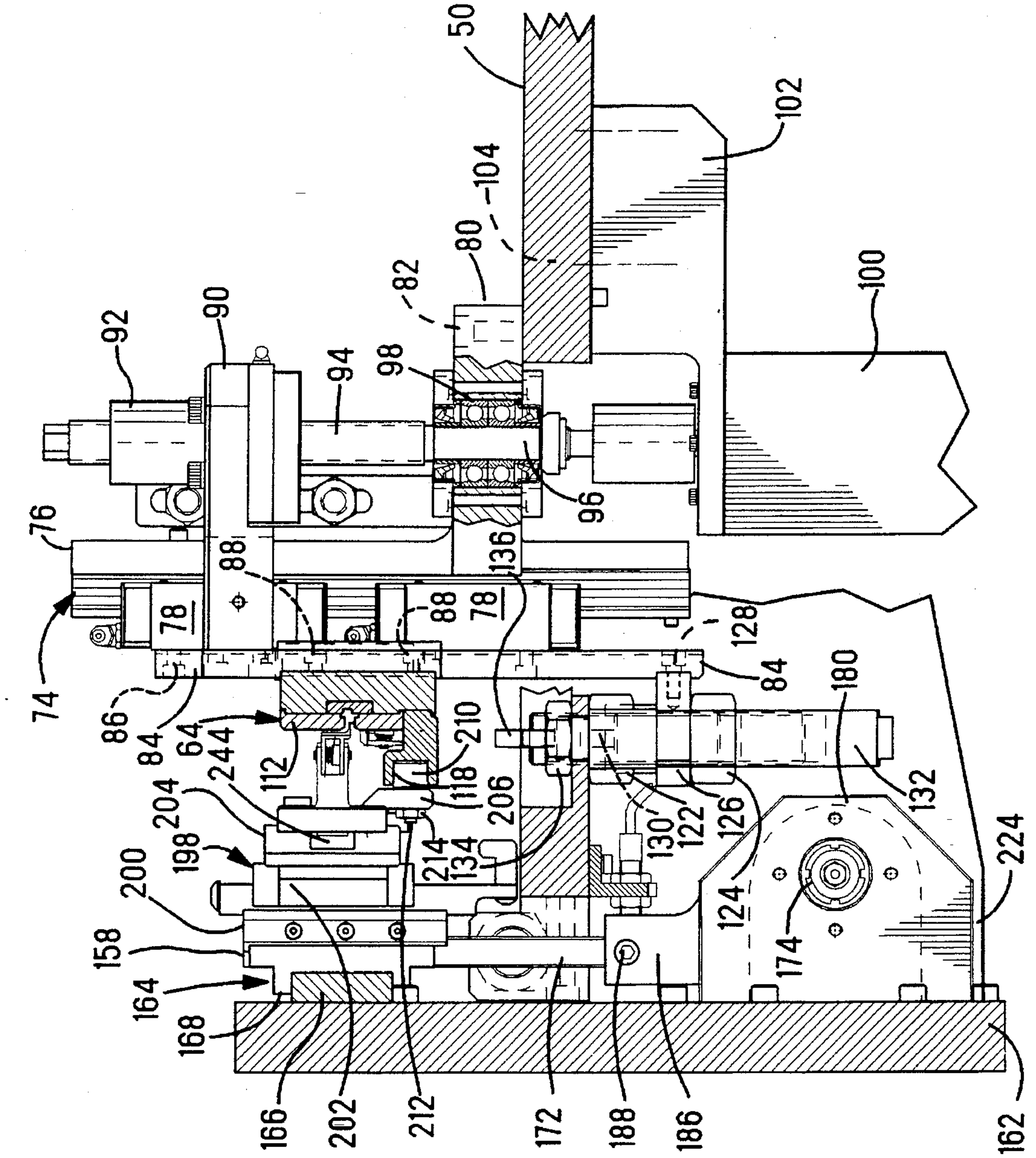
FIG. 8 is a view similar to that of FIG. 7 showing the lateral positioning mechanism in operational position.
Figure 9:
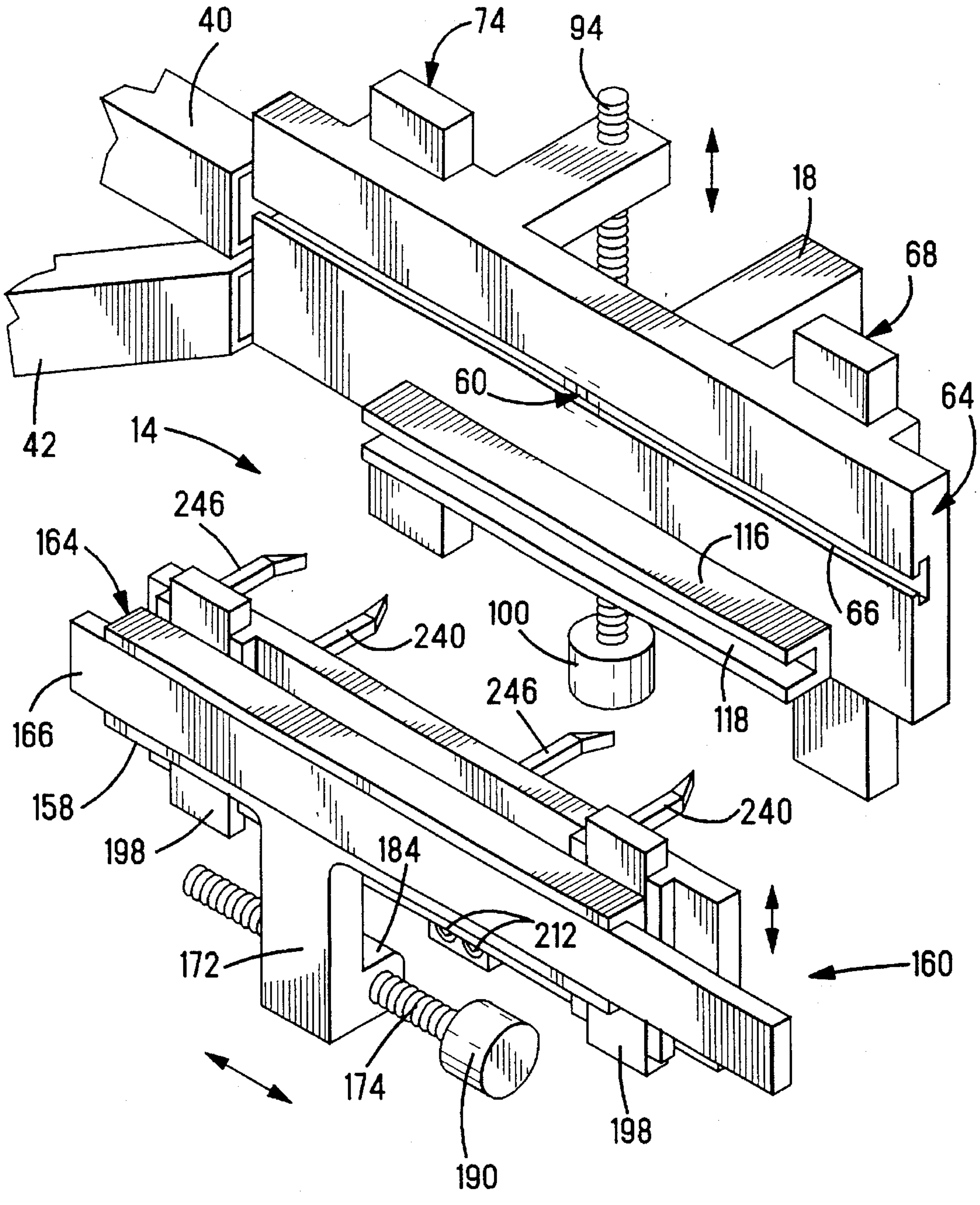
FIG. 9 is an isometric schematic representation of the functional element of the positioning mechanism shown in FIG. 4.

In the following discussion of FIGS. 4 through 8, it will be helpful to refer to the functional schematic shown in FIG. 9 to gain a more intuitive understanding of the structure and operation of the positioning mechanism 14. There is shown in FIG. 4 a main plate 50 which is rigidly attached to the frame 12 of the machine 10. The hold down clip inserter 18 is attached to the main plate by means of four screws 52. The strip 34 of clips enters the inserter at the point 54. The inserter 18 includes a cutoff blade 56 for severing the clip 30 from the carrier strip 34 just prior to insertion into the housing. An insertion bar 58 is arranged to pick up and move the severed clip 30 from within the inserter into assembled engagement with a connector housing 26 that is in position in a workstation 60. As the clips 30 are severed from the carrier strip 34 and inserted into connector housings 26, the remaining carrier strip 34 is pulled through the mechanism by a feed unit 62, as seen in FIG. 5, and discarded. As shown in FIGS. 4 and 5, a track 64 having a longitudinally disposed opening 66 is arranged with the opening substantially parallel to the main plate 50. A vertically disposed slide 68 has its stationary portion 70 attached to the main plate and its movable portion attached to the track 64, near one end thereof. Another vertically disposed slide 74 has its stationary portion 76 attached to the main plate 50 by means of a right angle flange 80 and screws 82, as best seen in FIGS. 4 and 7. The movable portion 78 of the slide 74 is composed of two spaced apart separate slide portions attached to a plate 84 by means of screws 86. The track 64 is attached to the plate 84 by means of screws 88. The upper portion of the movable portion 78, as viewed in FIG. 7, has a right angle flange 90 extending therefrom containing a ball nut assembly 92. A mating ball screw 94 is in engagement with the ball nut and includes a shank 96 that is journaled for rotation in a bearing 98 that is retained in the flange 80. An electric servo motor 100 is attached to the under side of the main plate 50 by means of a bracket 102 and screws 104. The motor 100 includes a shaft 106 that is drivingly coupled to the shank 96 of the ball screw 94 so that, as the motor turns the ball screw, the movable portion 78 of the slide 74 is made to move up or down, as viewed in FIGS. 5 and 7, carrying the track 64 with it. The two slides 68 and 74 are arranged perpendicular to the main plate 50 so that as the track 64 is made to move up and down by the motor 100, the opening 66 remains parallel to the main plate 50. As shown in FIGS. 4, 5, and 7, the track 64 includes a backing bar 108 and a replaceable housing guide bar 110 disposed in a longitudinal slot formed in the backing bar for its entire length. This housing guide bar 110 may be replaced with other suitable guide bars for accommodating other connector housings, as desired. A pair of retainer bars 112 is attached to the backing bar 108 by means of screws 114, as best seen in FIG. 5, and includes a rabbet along one edge of each bar that cooperates with the housing guide bar 110 to form the opening 66. The opening 66 runs for substantially the entire length of the track 64 and is sized and shaped to receive and accurately guide the housing 26 into the workstation 60 and then into either the tube package 40 or the discard chute 42. A slotted bar 116 having acam slot or simply slot 118 formed therein is attached to the backing bar 108 by means of screws 120, as shown in FIG. 5, and is spaced just below and parallel to the opening 66. The purpose of the slotted bar 116 will be explained below. A shock absorber 122 is threaded into a hole formed in the main plate 50, as best seen in FIGS. 4, 5, and 7, and has a piston rod 124 that extends above the top surface of the main plate 50 directly under the left end of the slotted bar 116, as viewed in FIG. 4. The purpose of this shock absorber is to limit and cushion the downward movement of the mechanism in the event that the motor 100 malfunctions. Another shock absorber 124 is threaded into a hole in a flange 126 that is attached to the plate 84 by means of screws 128 and moves up and down with the movable portion 78 of the slide 74. The shock absorber 124 includes a piston rod 130 that is in alignment with and will abut the bottom surface of the main plate 50 to limit and cushion the upward movement of the slide 74 for a purpose similar to that of the shock absorber 122. An air cylinder 132 is secured in a hole formed in the main plate 50 by means of a nut 134, as best seen in FIG. 7. The air cylinder 132 includes a piston rod 136 that extends upwardly into engagement with the underside of the slotted bar 116, as shown in FIG. 7. The cylinder 132 is pressurized sufficiently to counterbalance the weight of the track 64 and other apparatus carried by the slide portions 78 so that the movable part of the mechanism is easily moved by the motor 100. A recess 138 is formed in a front edge 140 of the main plate 50, as best seen in FIG. 4. A pair of shock absorbers 142 are mounted within the recess 138 by means of a pair of blocks 144 and screws 146. The two shock absorbers 142 have mutually opposing piston rods 148 that serve a purpose that will be explained below.

Actual positioning of the connector housings 26 within the track 64 and in alignment with the inserter 118 is accomplished by means of a lateral positioning mechanism 160 that employs a, so called, walking beam that carries precisely movable position fingers for lightly gripping the housing and transporting it along the track. This mechanism 160 will now be described in detail. As shown in FIGS. 4, 6, and 7, the mechanism 160 includes a vertical plate 162, and a horizontally disposed slide 164 having a stationary portion 166 that is attached to the vertical plate by means of screws 170 and two movable portions 168. The movable portions 168 are secured to a rectangularly shaped feed bar 158 that is arranged so that it is directly opposite and moves substantially parallel to the opening 66 in the track 64. A transport bar 172 is secured to the feed bar 158 and is coupled to a drive mechanism. The drive mechanism includes a ball lead screw 174 journaled in bearings 176 and 178 that are retained in spaced flanges 180 and 182, respectively, the flanges being attached to the vertical plate 162. The ball lead screw 174 is in mated engagement with a ball nut 184 having a plate 186 mounted to and extending therefrom, the plate being attached to the transport bar 172 by two screws 188. A servo motor 190 is mounted to a bracket 192 which is secured to the vertical plate 162 by two screws 194, as best seen in FIG. 4. The shaft 196 of the motor 190 is coupled to the ball lead screw 174 so that the motor rotates the lead screw, which in turn, moves the feed bar 158 and the movable portions 168 of the slide 164. A pair of slides 198, each having stationary portions 200 secured to and carried by the feed bar 158, are disposed so that their movable portions 202 move in a second direction, vertically as shown in FIG. 7, that is parallel to the direction of movement of the track 64 when moved by the motor 100. A beam 204 is attached to the two movable portions 202 of the slides 198 and arranged substantially parallel to the feed bar 158, as shown in FIGS. 4, 6, and 7. With this arrangement, the beam 204 is free to move vertically in the second direction by the slides 198, as viewed in FIG. 7, and horizontally by the slide 164, as viewed in FIG. 6. A cam follower bracket 206 is secured to the beam 204 by means of four screws 208, as shown in FIG. 7. A pair of cam follower rollers 210 are journaled for rotation on studs 212 that are attached to the bracket 206 by nuts 214. The bracket 206 is positioned vertically, as viewed in FIG. 7, so that the rollers 210 are in alignment with the slot 118. The rollers 210 are sized so that they will enter into following engagement with the slot 118 with little vertical play. It will be understood that, while two rollers 210 are utilized in the present example, a single roller 210 may also be advantageously utilized as well as a fixed follower that does not rotate. As the servo motor 190 is operated, the transport bar 172 moved the beam 204 left or right, as appropriate for the operation being performed, and the cam follower rollers 210 follow in the slot 118. The transport bar 172 is in alignment with the two shock absorber piston rods 148 which limit horizontal movement the bar 172 and the beam 204 in the event that the servo motor 190 malfunctions.

The vertical plate 162 is coupled to the main plate 50 by means of a pair of plates 224 rigidly secured to the underside of the main plate 50 with screws 226, as shown in FIG. 5. Note that only one plate 224 is shown. Each plate 224 has a front edge 230 to which is attached the inside face of the vertical plate 162 by means of two screws 232, as shown in FIGS. 6 and 7. Two sets of housing engaging fingers are positioned along the beam 204, as best seen in FIGS. 4 and 6. Each set of fingers includes a right finger 240 and an opposing left finger 246 secured by means of screws 242 that are threaded into the beam 204. Each finger 240 and 246 has a feed element 254 and 256, respectively, pivotally attached thereto and extending outwardly and into the opening 66 of the track 64. The feed elements are spring biased so that opposing elements 254 and 256 cooperate to engage and lightly grip the housing 126 within the opening 66. A pair of spring loaded latch pawls 248 are pivotally attached within cavities in the track 64 and are positioned so that they interfere with movement of the connector housings in the opening 66 from left to right, as viewed in FIG. 5, but permit passage of the housing in the opposite direction. These latch pawls 248 cooperate with the feed elements 254 by holding the housing in position while the feed elements 254 pass over and captures the housing between the two elements 254 and 256 in the usual manner. Another feed finger 258 with a feed element 260 is positioned adjacent the left end of the beam 204 and serves to engage the completed connector 24 and move it into the tube package 40 or into the discard chute 42, as appropriate.

In operation, the servo motor 190 is actuated so that the housing 26 is picked up by the right most set of feed fingers 240 and 246 and moved along the track 64 into the workstation 60 and into horizontal alignment with the hold down clip inserter 18. Concurrently, the servo motor 100 is actuated to vertically position he housing 26 so that the inserter 18 will be in position to insert the clip 30 into the left most position in the housing, as viewed in FIG. 3. As the servo motor 100 moves the track 64 up or down, as required, the lateral positioning mechanism 160 follows this movement by virtue of the slotted bar 116 and the follower rollers 210, so that the feed elements 254 and 256 remain in engagement with their respective connector housings 26. The first clip 30 is then inserted into the housing and the servo motor 190 is actuated to move the connector housing 26 to the left, as viewed in FIG. 4, until the right end of the housing is in horizontal alignment with the inserter 18. Concurrently, the servo motor 100 is actuated to vertically position the housing so that the inserter 18 will be in position to insert the clip 30 into the right most position in the housing, as viewed in FIG. 3. As above, when the servo motor 100 moves the track 64 up or down, the lateral positioning mechanism 160 follows this movement so that the feed elements 254 and 256 remain in engagement with their respective connector housings 26. The second clip 30 is then inserted into the housing and the servo motor 190 is actuated to move the connector housing 26 further to the left, as viewed in FIG. 4. As this movement occurs the servo motor 100 is again actuated to position the opening 66 in alignment with either the tube package 40 or the discard chute 42, as shown in FIG. 9. The feed element 260 then moves the completed connector 24 into the tube package or the discard chute.

While only two hold down clips 30 are inserted, in the present example, and the completed connector is directed to either a tube package 40 or a chute 42, it will be understood that the positioning mechanism 14 may be utilized for positioning the connector housing at any number of levels for such operations and for directing the connector to other destinations. Additionally, the mechanism 14 may be advantageously utilized for positioning the connector housing with respect to other workstations where other manufacturing operations may be performed. Such other operations may include contact insertion, marking, heat treatment, assembly to other parts, inspection, as well as other operations.

An important advantage of the present invention is that the connector housing positioning mechanism preserves the convenient flow of connector housings through the feed track while providing orthogonal motion for accurately positioning the housing for insertion of parts at different levels with respect to the feed track. This is accomplished by coupling the vertical motion mechanism to the horizontal motion mechanism by a horizontal slot and follower thereby reducing the complexity of the mechanisms. Further, this permits mounting the two drive motors on structural element that are attached directly to the frame of the machine thereby reducing the amount of mass of the moving mechanism. This permits the use of smaller drive motors and supporting structure.

I claim:

1. A positioning mechanism for positioning a connector housing in a workstation of a machine, said machine including a frame and tooling adjacent to said workstation for effecting a work operation within said workstation, said positioning mechanism comprising:

(a) a track coupled to said frame for guiding said connector housing along a feed path and into said workstation, said track arranged to move in a first direction generally perpendicular to said feed path to align said housing with said tooling;

(b) a beam coupled to said frame and arranged to move in a second direction parallel to said first direction and in a third direction parallel to said feed path;

(c) at least one feed finger attached to said beam, extending toward said track, and arranged to engage said connector housing and move it within said track along said feed path into alignment with said tooling when said beam moves in said third direction; and (d) coupling means for coupling said beam to said track so that movement of said track in said first direction directly causes movement of said beam only in said second direction.

2. The positioning mechanism according to claim 1 including a first drive attached to said frame and arranged to effect movement of said track in said first direction and a second drive attached to said frame and arranged to effect movement of said beam only in said third direction.

3. The positioning mechanism according to claim 2 wherein said track includes a longitudinal opening extending the length of said track, said opening defining said feed path and being sized to receive said connector housing so that said housing is free to undergo controlled movement within said opening along said feed path and wherein said finger extends into said opening for effecting said engagement with and controlled movement of said housing.

4. The positioning mechanism according to claim 3 wherein said coupling means includes a cam attached to one of said track and said beam, and a cam follower attached to the other of said track and said beam, said cam follower being arranged in following engagement with said cam.

5. The positioning mechanism according to claim 4 wherein said cam is defined by walls of a slot formed in said track parallel to said feed path, and said cam follower is a roller extending from said beam for reception in said slot and journaled for rotation.

6. The positioning mechanism according to claim 4 further comprising a feed bar slidingly coupled to said frame so that said feed bar is slidable back and forth in said third direction and wherein said beam is slidingly coupled to said feed bar so that said beam is slidable back and forth in said second direction.

7. The positioning mechanism according to claim 6 wherein said second drive effects movement of said beam in said third direction by directly moving said feed bar in said third direction.

8. The positioning mechanism according to claim 7 wherein said track includes a ball nut attached thereto and said first drive includes a first electric motor and a ball screw in engagement with said ball nut, said ball screw being rotated by said first electric motor.

9. The positioning mechanism according to claim 8 wherein said feed bar includes a ball nut attached thereto and said second drive includes a second electric motor, independent of said first electric motor, and a ball screw in engagement with said ball nut, said ball screw being rotated by said second electric motor.

10. The positioning mechanism according to claim 9 including at least two exit ports for receiving a completed said connector housing, wherein said opening of said track is selectively positionable in alignment with either of said two exit ports by effecting movement of said track in said first direction.

11. The positioning mechanism according to claim 10 wherein said at least two exit ports include a tube package and an exit chute for receiving said connector housing.

* * * * *